US010283355B2

(12) United States Patent
Bu (10) Patent No.: US 10,283,355 B2
(45) Date of Patent: May 7, 2019

(54) METHOD FOR MANUFACTURING POLY-SILICON LAYER, THIN FILM TRANSISTOR, ARRAY SUBSTRATE AND DISPLAY DEVICE

(71) Applicant: BOE TECHNOLOGY GROUP CO., LTD., Beijing (CN)

(72) Inventor: Qianqian Bu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 3 days.

(21) Appl. No.: 15/715,942

(22) Filed: Sep. 26, 2017

(65) Prior Publication Data

US 2018/0122634 A1 May 3, 2018

(30) Foreign Application Priority Data

Oct. 27, 2016 (CN) .......................... 2016 1 0954680

(51) Int. Cl.
*H01L 21/02* (2006.01)
*H01L 27/12* (2006.01)
*H01L 29/786* (2006.01)

(52) U.S. Cl.
CPC .... *H01L 21/02381* (2013.01); *H01L 21/0245* (2013.01); *H01L 21/02422* (2013.01);
(Continued)

(58) Field of Classification Search
CPC .............................................. H01L 21/02381
(Continued)

(56) References Cited

U.S. PATENT DOCUMENTS 5,403,751 A * 4/1995 Nishida ........... H01L 31/022425
117/915
5,585,291 A 12/1996 Ohtani et al.
(Continued)

FOREIGN PATENT DOCUMENTS

CN     1311524 A    9/2001
CN   101807609 A    8/2010
(Continued)

OTHER PUBLICATIONS

Chinese Search Report and Written Opinion for Application No. 201610954680.X dated Apr. 27, 2017, 6 Pages.
(Continued)

*Primary Examiner* — Igwe U Anya
(74) *Attorney, Agent, or Firm* — Brooks Kushman P.C.

(57) ABSTRACT

The present disclosure provides a method for manufacturing a poly-silicon layer. The method for manufacturing the poly-silicon layer comprises steps of: depositing a porous metal film on a microcrystalline silicon layer of a base substrate; immersing the base substrate deposited with the porous metal film into an etching liquid comprising hydrogen fluoride and oxidants for etching the microcrystalline silicon layer; after the microcrystalline silicon layer has been etched successfully, removing the metal film with an acid solution and washing the microcrystalline silicon layer with a deionized water subsequently so as to obtain a processed microcrystalline silicon layer; and depositing an amorphous silicon layer on the processed microcrystalline silicon layer and subjecting the amorphous silicon layer to laser annealing treatment so as to obtain the poly-silicon layer. The present disclosure further provides a thin film transistor, an array substrate and a display device comprising the poly-silicon layer manufactured according to the above-described method.

20 Claims, 4 Drawing Sheets

(52) U.S. Cl.
CPC .. *H01L 21/02488* (2013.01); *H01L 21/02513* (2013.01); *H01L 21/02532* (2013.01); *H01L 21/02595* (2013.01); *H01L 21/02658* (2013.01); *H01L 21/02675* (2013.01); *H01L 21/02686* (2013.01); *H01L 27/1222* (2013.01); *H01L 27/1285* (2013.01); *H01L 29/78675* (2013.01)

(58) Field of Classification Search
USPC .......................................................... 257/72
See application file for complete search history.

(56) References Cited

U.S. PATENT DOCUMENTS

| | | | |
|---|---|---|---|
| 2002/0005519 A1 | 1/2002 | Muramatsu et al. | |
| 2004/0002204 A1* | 1/2004 | Tsai ................... | H01L 21/28556 438/592 |
| 2007/0048915 A1* | 3/2007 | Ting ................... | H01L 29/66757 438/166 |
| 2013/0078508 A1* | 3/2013 | Tolbert ................ | H01M 4/134 429/188 |

FOREIGN PATENT DOCUMENTS

| | | |
|---|---|---|
| CN | 103489788 A | 1/2014 |
| CN | 103972050 A | 8/2014 |
| CN | 104779139 A | 7/2015 |
| CN | 105470312 A | 4/2016 |
| EP | 0984317 A2 | 3/2000 |
| RU | 2539120 C1 * | 1/2015 |

OTHER PUBLICATIONS

First Office Action for Chinese Application No. 201610954680.X, dated Jul. 4, 2017, 7 Pages.
Second Office Action for Chinese Application No. 201610954680.X, dated Aug. 30, 2017, 6 Pages.
Third Office Action for Chinese Application No. 201610954680.X, dated Nov. 21, 2017, 6 Pages.
$1^{st}$ Chinese Office Action, English Translation.
$2^{nd}$ Chinese Office Action, English Translation.
$3^{rd}$ Chinese Office Action, English Translation.
Chinese Search Report, English Translation.
CN105470312A, English Abstract and Machine Translation.
CN104779139A, English Abstract and Machine Translation.
CN103972050A, English Abstract and Machine Translation.
EP0984317A2, English Abstract and U.S. Equivalent U.S. Pat. No. 5,585,291.
CN101807609A, English Abstract and Machine Translation.
CN1311524A, English Abstract and U.S. Equivalent U.S. Pub. No. 2002/0005519.
CN103489788A, English Abstract and Machine Translation.

* cited by examiner

METHOD FOR MANUFACTURING POLY-SILICON LAYER, THIN FILM TRANSISTOR, ARRAY SUBSTRATE AND DISPLAY DEVICE

CROSS-REFERENCE TO RELATED APPLICATION

This application claims priority to Chinese Patent Application No. 201610954680.X filed on Oct. 27, 2016, which is incorporated herein by reference in its entirety.

TECHNICAL FIELD

The present disclosure relates to the field of display, in particular to a method for manufacturing a poly-silicon layer, a thin film transistor, an array substrate and a display device comprising the poly-silicon layer manufactured according to the method.

BACKGROUND

A thin film transistor is mainly formed of a source electrode, a drain electrode, a gate electrode, an active layer and a gate insulating layer. The active layer and the gate insulating layer are two key layers on which performances of a thin film transistor depend. According to different materials of which an active layer is made, thin film transistors may be classified into microcrystalline silicon thin film transistors (c-Si TFTs), amorphous silicon thin film transistors (a-Si TFTs), poly-silicon thin film transistors (p-Si TFTs), organic thin film transistors (OTFTs), and zinc oxide thin film transistors (ZnO TFTs).

P-Si TFTs have advantages such as higher electron mobility, higher aperture ratio, faster response speed and higher resolution, downsizing an assembly greatly and manufacturing integrated drive circuits. As compared with other TFTs, the p-Si TFTs are more suitable for high-frequency display with a large capacity. Moreover, the production cost of the p-Si TFTs is low. Therefore, the p-Si TFTs are used widely.

During the manufacturing of a p-Si TFT, a poly-silicon layer is usually converted from amorphous silicon to poly-silicon through low-pressure chemical vapor deposition, solid phase crystallization, metal induced crystallization, laser annealing treatment or other treatment. However, these processes now have defects such as poor grain uniformity and failure in controlling grain growth direction and grain boundary effectively during the manufacturing. As a result, TFTs with excellent performance cannot be obtained.

SUMMARY

An object of the present disclosure is to provide a method for manufacturing a poly-silicon layer capable of controlling the grain boundary effectively so as to obtain a poly-silicon layer with uniform grain, excellent crystallization and controllable grain size.

Further, an object of the present disclosure is to provide a poly-silicon thin film transistor, an array substrate and a display device manufactured according to the above method.

In one aspect, the present disclosure provides a method for manufacturing a poly-silicon layer, comprising steps of:
  depositing a porous metal film on a microcrystalline silicon layer of a base substrate;
  immersing the base substrate deposited with the porous metal film into an etching liquid comprising hydrogen fluoride and oxidants for etching the microcrystalline silicon layer;
  after the microcrystalline silicon layer has been etched successfully, removing the metal film on the microcrystalline silicon layer with an acid solution and washing the microcrystalline silicon layer with a deionized water subsequently so as to obtain a processed microcrystalline silicon layer; and
  depositing an amorphous silicon layer on the processed microcrystalline silicon layer and subjecting the microcrystalline silicon layer to a laser annealing treatment so as to obtain the poly-silicon layer.

Optionally, the porous metal film is made of silver, gold or platinum.

Optionally, the porous metal film is made of silver.

Optionally, the step of depositing the porous metal film on the microcrystalline silicon layer comprises:
  immersing the base substrate formed with the microcrystalline silicon layer into a mixed solution comprising 3-5 mol/L hydrogen fluoride and 0.01-0.03 mol/L silver nitrate, and depositing a silver layer on the microcrystalline silicon layer for 50-70 seconds.

Optionally, the etching liquid comprises hydrogen fluoride and ferric nitrate, or hydrogen fluoride and hydrogen peroxide.

Optionally, the microcrystalline silicon layer has a thickness of about 5 to about 10 nm.

Optionally, the porous metal film is a catalyst for etching reaction between the etching liquid and the microcrystalline silicon layer.

Optionally, the porous metal film comprises metal particles and has pore structures between the metal particles.

Optionally, the pore structures of the porous metal film are uniformly distributed.

In another aspect, the present disclosure further provides a poly-silicon thin film transistor, comprising the poly-silicon layer manufactured according to the above-described method as an active layer.

Optionally, the poly-silicon thin film transistor further comprises a buffer layer between the base substrate and the poly-silicon layer.

Optionally, the buffer layer is a SiN layer with a thickness of about 50 to 100 nm or a SiO layer with a thickness of about 150 to about 300 nm.

In another aspect, the present disclosure further provides an array substrate, comprising the above-described poly-silicon thin film transistor.

In still another aspect, the present disclosure further provides a display device, comprising the above-described array substrate.

REFERENCE SIGN LIST

1. Base substrate; 2. buffer layer; 3. microcrystalline silicon layer; 31. silicon seed; 4. metal layer; 41. metal particles of metal layer; 5. amorphous silicon layer; 6. excimer laser; 7. poly-silicon layer; 8. gate insulating layer; 9. gate electrode; 10. interlayer insulating layer; 11. source/drain metal layer.

DETAILED DESCRIPTION

To further understand the present disclosure, the technical solution of the present disclosure will be described hereinafter in conjunction with specific embodiments. However, it shall be understood that the description is only for further specifying features and advantages of the present disclosure, rather than limiting its claims.

According to an embodiment of the present disclosure, it is provided a method for manufacturing a poly-silicon layer, comprising steps of depositing a porous metal film on a microcrystalline silicon layer of a base substrate; immersing the base substrate formed with the porous metal film into an etching liquid which comprises hydrogen fluoride and oxidants so as to etch the microcrystalline silicon layer; after the microcrystalline silicon layer has been etched successfully, removing the metal film on the microcrystalline silicon layer with an acid solution and washing the microcrystalline silicon layer with a deionized water subsequently so as to obtain a processed microcrystalline silicon layer; and depositing an amorphous silicon layer on the processed microcrystalline silicon layer and subjecting the amorphous silicon layer to laser annealing treatment so as to obtain the poly-silicon layer.

In the method for manufacturing the poly-silicon layer according to the present disclosure, the porous metal film deposited on the microcrystalline silicon layer acts as a catalyst so as to promote the etching of the microcrystalline silicon layer. That is, microcrystalline silicon in an area covered with the metal film is corroded rapidly, but microcrystalline silicon is corroded slowly or not corroded in an area not covered with the metal film, such that silicon seeds with identical crystallization direction and uniform grain size are formed. The method according to the present disclosure can obtain silicon seeds with substantially identical grain orientation and uniform grain size in an effective manner by controlling the uniformity and pore structures of the metal film as well as etching rate or the like. When depositing an amorphous silicon layer on the silicon seeds and then subjecting the amorphous silicon layer to a laser annealing treatment, the poly-silicon growth direction and grain boundary area can be controlled so as to manufacture a poly-silicon layer with excellent crystallization and uniform, greater grain size.

Figure 1:
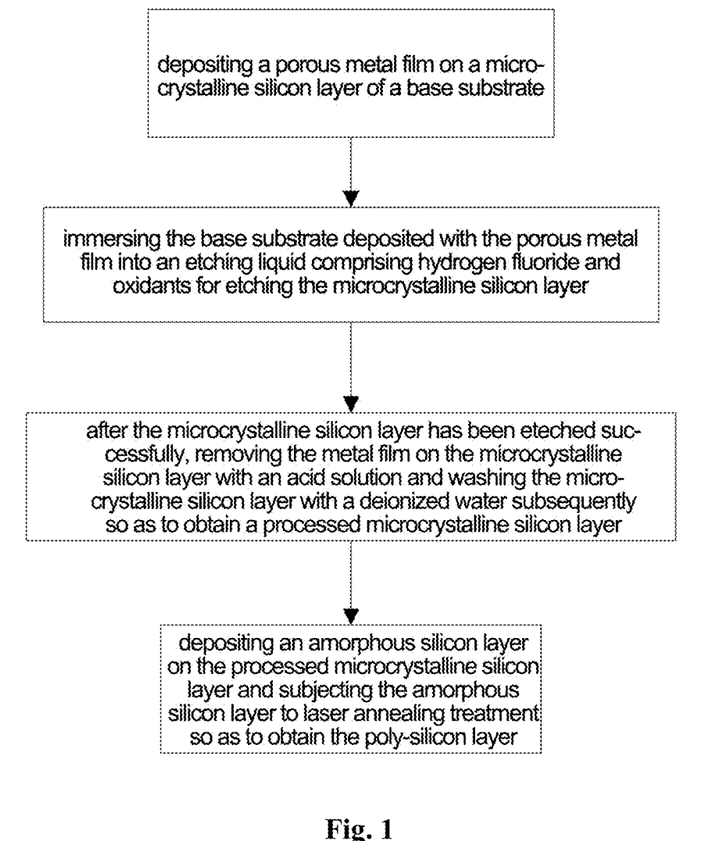
FIG. 1 is a flowchart showing a method for manufacturing a poly-silicon layer according to the present disclosure.

The flowchart of the method for manufacturing the poly-silicon layer according to the embodiment of the present disclosure is as shown in FIG. 1.

In the method for manufacturing the poly-silicon layer according to the embodiment of the present disclosure, the porous metal film is firstly deposited on the microcrystalline silicon layer of the base substrate. The microcrystalline silicon layer may be directly arranged on the base substrate. It is further possible to arrange a buffer layer firstly and then arrange the microcrystalline silicon layer on the buffer layer. The buffer layer may prevent alkaline ions in the base substrate, for example, a glass substrate, from permeating into a thin film transistor in an effective manner, and simultaneously enables contact interface between the base substrate and the poly-silicon layer to have a good performance so as to increase performance of the thin film transistor. Optionally, the buffer layer is a SiN layer with a thickness of about 50 to about 100 nm or a SiO layer with a thickness of about 150 to about 300 nm. The porous metal film comprises aggregation areas of metal particles and pore structures among metal particles. The microcrystalline silicon layer in a pore area is not covered with metal. Optionally, the metal film is a porous metal film with uniform pore distribution. For example, the metal film may be manufactured through a conventional template method.

Optionally, the porous metal film is made of silver, gold or platinum. Further, the porous metal film is made of silver. Optionally, the porous metal film is made of silver, the step of depositing the porous metal film on the microcrystalline silicon layer comprises immersing the base substrate formed with the microcrystalline silicon layer into a mixed solution comprising about 3 to about 5 mol/L hydrogen fluoride and about 0.01 to about 0.03 mol/L silver nitrate, and depositing a silver layer on the microcrystalline silicon layer of the base substrate for 50-70 seconds. Optionally, the deposition time is for example 55, 60 or 65 seconds.

After depositing the porous metal film, the base substrate formed with the porous metal film is immersed into an etching liquid which comprises hydrogen fluoride and oxidants for etching the microcrystalline silicon layer. Optionally, the oxidants may be one or more selected from a group consisting of hydrogen peroxide, silver nitrate, ferric nitrate, potassium permanganate and potassium chloroaurate. Further optionally, the oxidants are hydrogen peroxide or ferric nitrate. During the etching, microcrystalline silicon in the microcrystalline silicon layer is subjected to local oxidation and decomposition in the etching liquid comprising hydrogen fluoride and oxidants. The porous metal film acts on a catalyst so as to promote the microcrystalline silicon to be etched with oxidants. Microcrystalline silicon contacting with metal obtains holes from oxidants to form silicon oxides. The silicon oxides react with hydrogen fluoride and are dissolved. This process occurs rapidly in an interface between the metal and the microcrystalline silicon so as to cause the microcrystalline silicon covered with the metal to be corroded inward rapidly. The microcrystalline silicon not covered with the metal reacts very slowly under the action of hydrogen fluoride and oxidants, finally forming silicon seeds with identical crystallization direction and uniform grain size.

Optionally, the etching liquid comprising hydrogen fluoride and oxidants is a mixture of about 0.2-0.5 mol/L hydrogen fluoride and about 8-12 mol/L ferric nitrate, or a mixture of 0.2-0.5 mol/L hydrogen fluoride and 0.04-0.08 mol/L hydrogen peroxide. The porous metal film acts as a catalyst so as to promote the microcrystalline silicon to be etched with oxidant. Optionally, the etching temperature is about 50-80° C. Further optionally, the etching temperature is about 60-70° C. Optionally, the etching time is about 150-300 seconds. Further optionally, the etching time is about 200-250 seconds.

Figure 2:
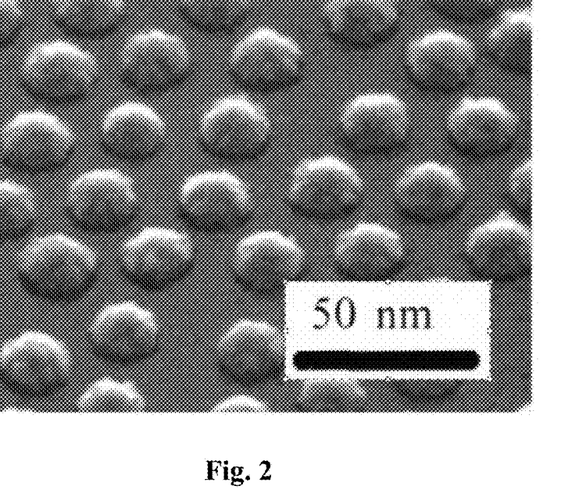
FIG. 2 is a Scanning Electron Microscope (SEM) graph showing silicon seeds formed according to a method of the present disclosure.

FIG. 2 is a SEM graph showing silicon seeds formed in the method according to an embodiment of the present disclosure.

In the method for manufacturing the poly-silicon layer according to the embodiment of the present disclosure, after the microcrystalline silicon layer has been etched successfully, the metal film is removed with an acid solution and the microcrystalline silicon layer is washed with a deionized water so as to obtain a processed microcrystalline silicon layer. Washing with the acid solution functions to remove the metal film so that the acid solution can be selected according to the type of the deposited metal film as long as the selected acid solution can dissolve and remove the metal film. Optionally, the acid solution is about 4-6 mol/L nitric acid. Washing with the deionized water is performed several times after washing with the acid solution so as to remove residual acid solution and other impurities like metal ions.

In the method for manufacturing the poly-silicon layer according to the embodiment of the present disclosure, after obtaining the processed microcrystalline silicon layer, an amorphous silicon layer is deposited on the processed microcrystalline silicon layer and subjected to a laser annealing treatment so as to obtain the poly-silicon layer. The present disclosure does not limit the method of depositing the amorphous silicon layer particularly. Well-known processes, for example, Plasma Enhanced Chemical Vapor Deposition (PECVD) may be used for depositing. Optionally, the amorphous silicon layer has a thickness of about 40-50 nm.

The present disclosure uses excimer laser annealing process to manufacture the poly-silicon layer. The basic principle of this process is to irradiate a surface of an a-Si thin film with a high-energy excimer laser so as to enable microcrystalline silicon to be melt, cooled and thereby re-crystallized, which achieves conversion from amorphous silicon to poly-silicon. Low temperature poly-silicon thin film manufactured through the excimer laser annealing process has large grain size, good space selectivity, less intracrystalline deficiency, good electrical properties and the like. This process is a main process for manufacturing the poly-silicon layer at a lower temperature. Conditions of the laser annealing process will influence performance of the finally formed poly-silicon grain such as grain size and degree of crystallinity. Optionally, the laser for annealing has an energy density of about 390-410 mJ/cm$^2$. For example, a laser with a frequency of about 300 Hz and a spot overlap ratio of about 98% may be used.

The silicon grain of the poly-silicon layer manufactured according to the method of the present disclosure has a size of about 330-380 nm and a grain uniformity of 3σ<150 nm.

Figure 3:
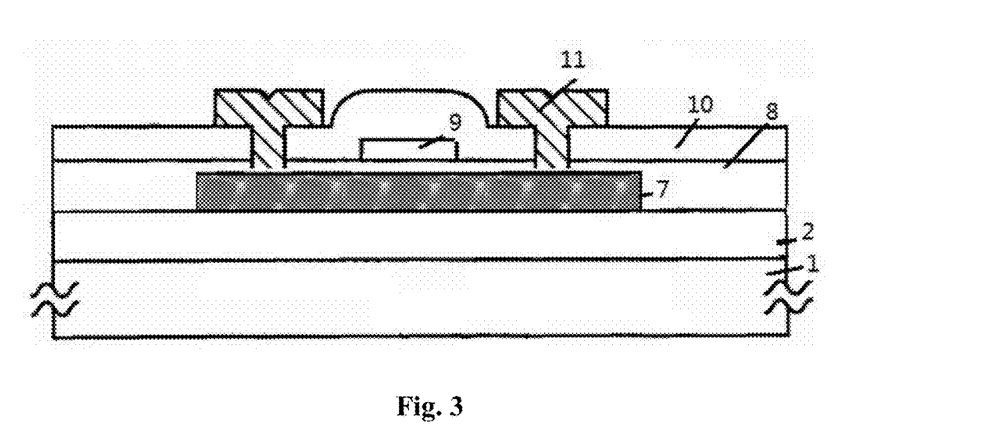
FIG. 3 is a schematic view showing a structure of a poly-silicon thin film transistor according to an embodiment of the present disclosure.

According to another embodiment of the present disclosure, it is provided a poly-silicon thin film transistor, comprising the poly-silicon layer manufactured according to the above-described method as an active layer. Optionally, the poly-silicon thin film transistor comprises a base substrate, and the above-manufactured poly-silicon layer, a gate insulating layer, a gate electrode, a source electrode and a drain electrode arranged on the base substrate, as shown in FIG. 3. Optionally, the poly-silicon thin film transistor further comprises a buffer layer arranged between the base substrate and the poly-silicon layer, and an interlayer insulating layer. Please refer to FIG. 3 for detail.

In order to fully understand the method for manufacturing the poly-silicon layer and the manufactured poly-silicon thin film transistor according to the present disclosure, description will be made in detail in conjunction with FIG. 4.

According to specific embodiment of the present disclosure, the method for manufacturing the poly-silicon thin film transistor may comprise steps 1-10.

Figure 4A:
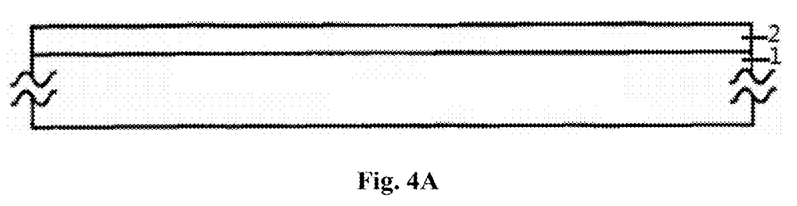
FIGS. 4A-4H are schematic views showing structures obtained from steps comprised in the method for manufacturing the poly-silicon thin film transistor according to the present disclosure.

Step 1: a base substrate is provided. Optionally, a buffer layer can be deposited on the base substrate. As shown in FIG. 4, 1 represents the base substrate, and 2 represents the buffer layer.

Optionally, the buffer layer is a SiN layer with a thickness of about 50-100 nm or a SiO layer with a thickness of about 150-300 nm. Adjusting the thickness of the buffer layer may prevent alkaline ions in the glass substrate from permeating into the thin film transistor in an effective manner, and simultaneously enables contact interface between the base substrate and the poly-silicon layer to have a good performance so as to increase performance of the thin film transistor.

Figure 4B:
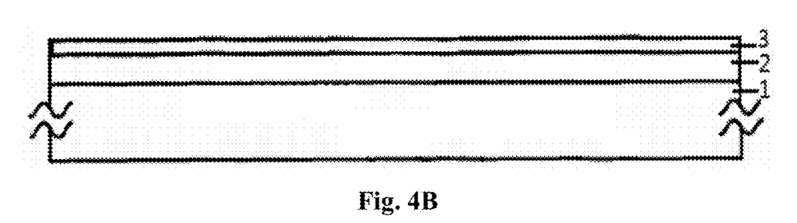

Step 2: a microcrystalline silicon layer is deposited on the buffer layer. As shown in FIG. 4B, 1 represents the base substrate, 2 represents the buffer layer, and 3 represents the microcrystalline silicon layer. Optionally, the microcrystalline silicon layer has a thickness of about 5-10 nm. If the microcrystalline silicon layer has a thickness of no less than 5 nm and no greater than 10 nm, silicon seeds formed of the microcrystalline silicon layer can be more uniform.

Figure 4C:
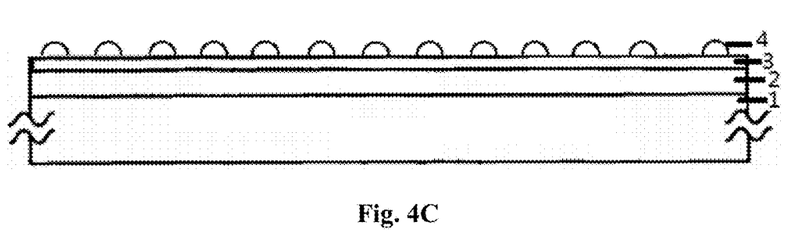

Step 3: a porous metal film is deposited on the microcrystalline silicon layer. As shown in FIG. 4C, 1 represents the base substrate, 2 represents the buffer layer, 3 represents the microcrystalline silicon layer, 4 represents the metal film, and 41 represents metal particles of the metal film. Gaps among the metal particles of the porous metal film are pore structures. The metal film is a porous metal film. Optionally, the metal film is made of silver, gold or platinum. Further, the metal film is made of silver. Optionally, the step of depositing the porous metal film on the microcrystalline silicon layer comprises: immersing the base substrate formed with the microcrystalline silicon layer into a mixed solution comprising about 3-5 mol/L hydrogen fluoride and about 0.01-0.03 mol/L silver nitrate, and depositing a silver layer on the base substrate for about 50-70 seconds. Optionally, the depositing time is about 60 seconds.

Figure 4D:
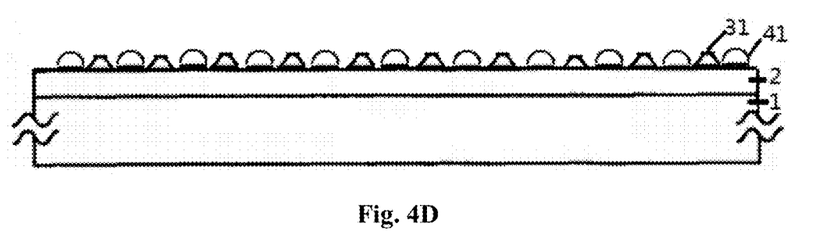

Step 4: the base substrate formed with the porous metal film is immersed into an etching liquid which comprises hydrogen fluoride and oxidants for etching the microcrystalline silicon layer. As shown in FIG. 4D, 31 represents silicon seeds. Microcrystalline silicon is corroded rapidly at an interface where the metal film contacts with the microcrystalline silicon. Microcrystalline silicon at the pore structure, i.e., microcrystalline silicon not covered with the metal, is formed with silicon seeds.

The microcrystalline silicon layer and the metal film have been deposited sequentially on the base substrate. Optionally, the oxidants may be one or more selected from a group consisting of hydrogen peroxide, silver nitrate, ferric nitrate, potassium permanganate and potassium chloroaurate. Further optionally, the oxidants are hydrogen peroxide or ferric nitrate. Optionally, the etching liquid comprising hydrogen fluoride and oxidants is a mixture of about 0.2-0.5 mol/L hydrogen fluoride and about 8-12 mol/L ferric nitrate, or a mixture of about 0.2-0.5 hydrogen fluoride and about 0.04-0.08 mol/L hydrogen peroxide. The porous metal film acts as a catalyst so as to promote the microcrystalline silicon to be etched with oxidants. Optionally, the etching temperature is about 50-80° C. Further optionally, the etching temperature is about 60-70° C. Optionally, the etching time is about 150-300 seconds. Further optionally, the etching time is about 200-250 seconds.

Figure 4E:
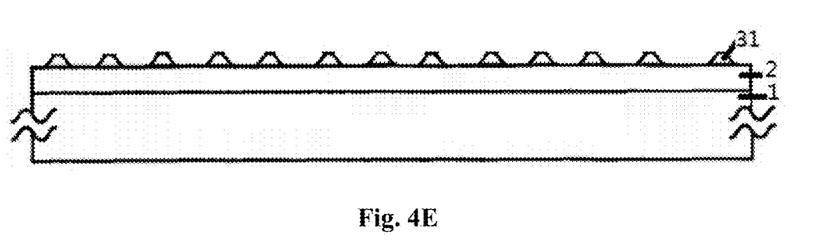

Step 5: after the microcrystalline silicon layer has been etched successfully, the metal film is removed with an acid solution and the microcrystalline silicon layer is washed with a deionized water so as to obtain a processed microcrystalline silicon layer. As shown in FIG. 4E, after washing, the metal film is removed while silicon seeds 31 retain. Washing with the acid solution functions to remove the metal film. The acid solution can be selected according to the deposited metal film. Optionally, the acid solution is about 4-6 mol/L nitric acid. Washing with the deionized water is performed several times after washing with the acid solution so as to remove residual acid solution and other impurities.

Figure 4F:
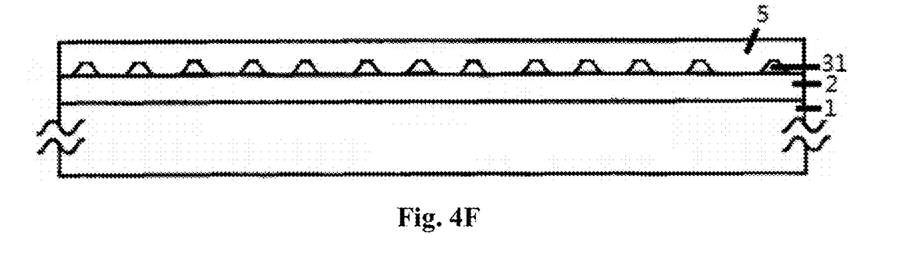
Figure 4G:
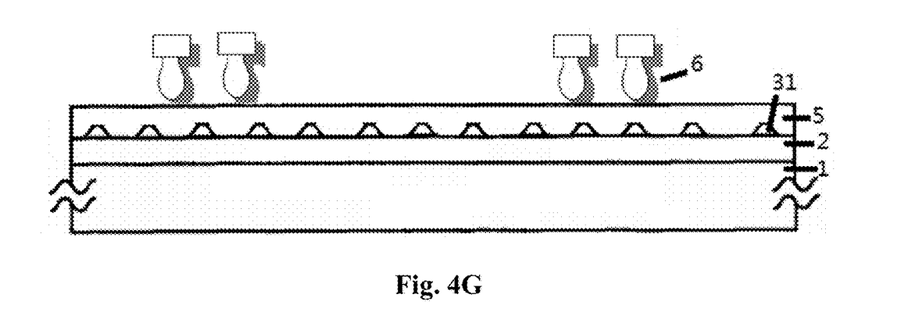
Figure 4H:
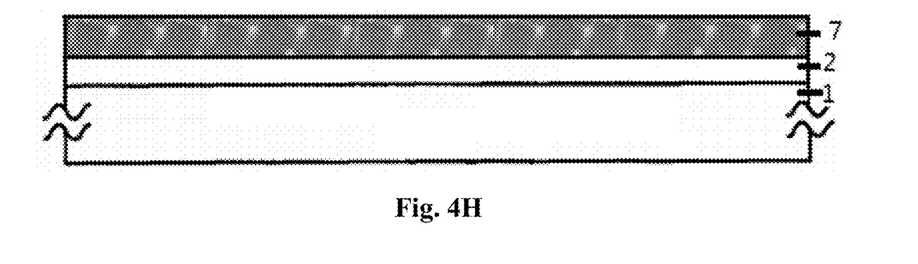

Step 6: an amorphous silicon layer is deposited on the processed microcrystalline silicon layer and subjected to a laser annealing treatment so as to form the poly-silicon layer. As shown in FIG. 4F, 5 represents the amorphous silicon layer. As shown in FIG. 4G, 6 represents an excimer laser. Irradiated the deposited amorphous silicon layer 5 with the excimer laser 6 can anneal and crystallize the amorphous silicon layer 5 so as to form the poly-silicon layer 7 as shown in FIG. 4H.

The present disclosure does not limit the method of depositing the amorphous silicon layer particularly. Processes such as PECVD may be used for depositing. Optionally, the amorphous silicon layer has a thickness of about 40-50 nm. Conditions of the laser annealing treatment will influence performance of the finally formed poly-silicon grain such as grain size and degree of crystallinity. Optionally, the laser for annealing has an energy density of about 390-410 mJ/cm$^2$ and a frequency of about 300 Hz.

The method further comprises steps 7-10, which relate to manufacturing an active layer, a gate electrode, a gate insulating layer, a source electrode and a drain electrode, and may be existing methods. Although the figures do not further show structures obtained from the steps 7-9, FIG. 3 has shown the structure of the poly-silicon thin film transistor manufactured in the steps 7-10.

Step 7: the poly-silicon layer is patterned so as to form an active layer of the thin film transistor.

Step 8: a gate insulating layer 8 is formed.

Step 9: a gate metal layer is deposited and patterned so as to form a gate electrode 9 of the thin film transistor.

Further, after forming the gate electrode 9, an interlayer insulating layer 10 can be further formed, and the gate insulating layer 8 and the interlayer insulating layer 10 are patterned so as to form a via hole.

Step 10: a source/drain metal layer 11 is deposited and patterned so as to form a source electrode and a drain electrode of the thin film transistor, wherein the source electrode and the drain electrode are connected to the active layer respectively through the via hole penetrating through the interlayer insulating layer 10 and the gate insulating layer 8.

The methods for manufacturing the active layer, the gate electrode, the gate insulating layer, the source electrode and the drain electrode involved in the steps 7-10 can be conducted according to existing methods, without particular limitation.

According to another embodiment of the present disclosure, it is provided an array substrate, comprising the above-described poly-silicon thin film transistor.

According to another embodiment of the present disclosure, it is provided a display device, comprising the above-described array substrate.

In order to further deep understand the present disclosure, the method for manufacturing the poly-silicon layer, the poly-silicon thin film transistor and the display device provided herein will be described in detail in conjunction with the following examples, but the protection scope of the present disclosure is not limited to these examples.

EXAMPLES

Example 1

A glass substrate is provided, and a layer of SiN buffer layer with a thickness of 70 nm is deposited on the glass substrate. A microcrystalline silicon layer with a thickness of 7.3 nm is deposited on the buffer layer. The glass substrate deposited with the microcrystalline silicon layer is immersed into a hydrogen fluoride/AgNO$_3$ solution with a hydrogen fluoride concentration of 4.2 mol/L and a silver nitrate concentration of 0.02 mol/L to deposit a porous Ag layer for 60 seconds.

At a reaction temperature of 65° C., the glass substrate is immersed into hydrogen fluoride/Fe(NO$_3$)$_3$ etching liquid with a hydrogen fluoride concentration of 0.25 mol/L and a ferric nitrate concentration of 10.0 mol/L to etch for 200 seconds.

The glass substrate is taken out, and the Ag layer is removed with a HNO$_3$ solution having a concentration of 5.0 mol/L. The glass substrate is washed with a large amount of deionized water, then dried. An amorphous silicon layer with a thickness of 45 nm is deposited through PECVD. A laser for adjusting annealing and crystallization has an energy density of 390 mJ/cm$^2$ and a spot overlap ratio of 98%. A poly-silicon layer with an average grain size of 380 nm and a grain uniformity of 3σ=120 nm is obtained.

The poly-silicon layer is patterned so as to form an active layer of the thin film transistor; a gate insulating layer is formed; a gate metal layer is deposited and patterned so as to form a gate electrode of the thin film transistor; a source/drain metal layer is deposited and patterned so as to form a source electrode and a drain electrode of the thin film transistor.

The performance testing results of the manufactured poly-silicon thin film transistor are as shown in table 1 below.

Example 2

A glass substrate is provided, and a layer of SiO buffer layer with a thickness of 210 nm is deposited on the glass substrate. A microcrystalline silicon layer with a thickness of 8.5 nm is deposited on the buffer layer. The glass substrate deposited with the microcrystalline silicon layer is immersed into a hydrogen fluoride/AgNO$_3$ solution with a hydrogen fluoride concentration of 4.2 mol/L and a silver nitrate concentration of 0.02 mol/L to deposit a porous Ag layer for 62 seconds.

At a reaction temperature of 65° C., the glass substrate is immersed into hydrogen fluoride/H$_2$O$_2$ etching liquid with a hydrogen fluoride concentration of 0.35 mol/L and a hydrogen peroxide concentration of 0.06 mol/L to etch for 200 seconds.

The glass substrate is taken out, and the Ag layer is removed with a HNO$_3$ solution having a concentration of 5.0 mol/L. The glass substrate is washed with a large amount of deionized water and then dried. An amorphous silicon layer with a thickness of 47 nm is deposited through PECVD. A laser for adjusting annealing crystallization has an energy density of 405 mJ/cm$^2$ and a spot overlap ratio of 95%. A poly-silicon layer with a grain size of 382 nm and a grain uniformity of 3σ=120 nm is obtained.

The poly-silicon layer is patterned so as to form an active layer of the thin film transistor; a gate insulating layer is formed; a gate metal layer is deposited and patterned so as to form a gate electrode of the thin film transistor; an interlayer insulating layer is deposited; a source/drain metal layer is deposited and patterned so as to form a source electrode and a drain electrode of the thin film transistor.

The performance testing results of the manufactured poly-silicon thin film transistor are as shown in table 1 below.

Example 3

A glass substrate is provided, and a layer of SiO buffer layer with a thickness of 210 nm is deposited on the glass substrate. A microcrystalline silicon layer with a thickness of 8.5 nm is deposited on the buffer layer. The glass substrate deposited with the microcrystalline silicon layer is immersed into a hydrogen fluoride/AgNO$_3$ solution with a hydrogen fluoride concentration of 7 mol/L and a silver nitrate concentration of 0.05 mol/L to deposit a porous Ag layer for 100 seconds.

At a reaction temperature of 100° C., the glass substrate is immersed into hydrogen fluoride/Fe(NO$_3$)$_3$ etching liquid with a hydrogen fluoride concentration of 0.7 mol/L and a ferric nitrate concentration of 15 mol/L to etch for 200 seconds.

The glass substrate is taken out, and the Ag layer is removed with a HNO$_3$ solution having a concentration of 5.0 mol/L. The glass substrate is washed with a large amount of deionized water and then dried. An amorphous silicon layer with a thickness of 47 nm is deposited through PECVD. A laser for adjusting annealing and crystallization has an energy density of 405 mJ/cm$^2$ and a spot overlap ratio of 98%. A poly-silicon layer with a grain size of 365 nm and a grain uniformity of 3σ=102 nm is obtained.

The poly-silicon layer is patterned so as to form an active layer of the thin film transistor; a gate insulating layer is formed; a gate metal layer is deposited and patterned so as to form a gate electrode of the thin film transistor; an interlayer insulating layer is deposited; a source/drain metal layer is deposited and patterned so as to form a source electrode and a drain electrode of the thin film transistor.

The performance testing results of the manufactured poly-silicon thin film transistor are as shown in table 1 below.

Comparative Example 1

A glass substrate is provided, and a layer of SiO buffer layer with a thickness of 210 nm is deposited on the glass substrate. An amorphous silicon layer with a thickness of 47 nm is deposited through PECVD. A laser for adjusting annealing and crystallization has an energy density of 405 mJ/cm$^2$ and a spot overlap ratio of 95%. A poly-silicon layer with a grain size of 325 nm and a grain uniformity of 3σ=166 nm is obtained.

The poly-silicon layer is patterned so as to form an active layer of the thin film transistor; a gate insulating layer is formed; a gate metal layer is deposited and patterned so as to form a gate electrode of the thin film transistor; an interlayer insulating layer is deposited; a source/drain metal layer is deposited and patterned so as to form a source electrode and a drain electrode of the thin film transistor.

The performance testing results of the manufactured poly-silicon thin film transistor are as shown in table 1 below.

TABLE 1

| Items | Example 1 | Example 2 | Example 3 | Comparative example 1 |
|---|---|---|---|---|
| Threshold voltage $V_{th}$ (V) | −1.7 ± 0.9 | −1.72 ± 0.9 | −2.1 ± 0.6 | −1.9 ± 0.5 |
| Mobility Mob (cm$^2$/Vs) | 92.1 | 93.2 | 79.4 | 69 |
| On state current $I_{on}$ (A) | 8.3E−5 | 8.31E−5 | 8.0E−5 | 1.0E−5 |
| Off state current $I_{off}$ (A) | 3.2E−12 | 3.05E−12 | 3.5E−11 | 1.0E−11 |

As can be seen from the above-described examples, when using the poly-silicon layer of the thin film transistor according to the method of the present disclosure, silicon seeds with identical orientation and uniform grain size are formed via the metal film, then the amorphous silicon layer is deposited on the silicon seeds and then annealing is carried out through the excimer laser such that a poly-silicon layer with a grain size of 360-380 nm and a grain uniformity of 3σ<120 nm is formed and a poly-silicon thin film transistor with more excellent performance such as better threshold value, reduced off state current and increased mobility and on state current is obtained.

Illustration of these examples is only for helping understanding of the method and inventive concept of the present disclosure. It should be noted that those of ordinary skill in the art may further make a number of improvements and modifications without departing from the principles of the present disclosure, which improvements and modifications should also be deemed to be within the scope of the present disclosure.

What is claimed is:

1. A method for manufacturing a poly-silicon layer by inducing growth of amorphous silicon layer by seed crystals, comprising steps of:
   depositing a porous metal film directly on a microcrystalline silicon layer which is deposited and located on a base substrate;
   immersing the base substrate deposited with the porous metal film into an etching liquid comprising hydrogen fluoride and an oxidant for etching the microcrystalline silicon layer;
   after the microcrystalline silicon layer has been etched, removing all of the metal film on the microcrystalline silicon layer with an acid solution and subsequently washing the microcrystalline silicon layer with a deionized water so as to obtain a processed microcrystalline silicon layer made of microcrystalline silicon particles with substantially identical grain orientation and uniform grain sizes; and
   depositing an amorphous silicon layer on the processed microcrystalline silicon layer and subjecting the amorphous silicon layer to laser annealing treatment to induce growth of amorphous silicon layer by using the microcrystalline silicon particles as seed crystals, thereby obtaining the poly-silicon layer.

2. The method according to claim 1, wherein the porous metal film is made of silver, gold or platinum.

3. The method according to claim 1, wherein the porous metal film is made of silver.

4. The method according to claim 3, wherein the step of depositing the porous metal film on the microcrystalline silicon layer comprises:
   immersing the base substrate formed with the microcrystalline silicon layer into a mixed solution comprising 3-5 mol/L hydrogen fluoride and 0.01-0.03 mol/L silver nitrate, and depositing a silver layer on the microcrystalline silicon layer of the base substrate for 50-70 seconds.

5. The method according to claim 1, wherein the etching liquid comprises hydrogen fluoride and ferric nitrate, or hydrogen fluoride and hydrogen peroxide.

6. The method according to claim 1, wherein the microcrystalline silicon layer has a thickness of 5-10 nm.

7. The method according to claim 1, wherein the porous metal film is a catalyst for etching reaction between the etching liquid and the microcrystalline silicon layer.

8. The method according to claim 1, wherein the porous metal film comprises metal particles and has pore structures among the metal particles.

9. The method according to claim 8, wherein the pore structures of the porous metal film are uniformly distributed.

10. A poly-silicon thin film transistor, comprising the poly-silicon layer manufactured by the method according to claim 1 as an active layer.

11. The poly-silicon thin film transistor according to claim 10, further comprising a buffer layer between the base substrate and the poly-silicon layer.

12. The poly-silicon thin film transistor according to claim 11, wherein the buffer layer is a SiN layer with a thickness of 50-100 nm or a SiO layer with a thickness of 150-300 nm.

13. The poly-silicon thin film transistor according to claim 10, wherein the porous metal film is made of silver, gold or platinum.

14. An array substrate, comprising the poly-silicon thin film transistor according to claim 10.

15. The array substrate according to claim 14, wherein the thin film transistor further comprises a buffer layer between the base substrate and the poly-silicon layer.

16. The array substrate according to claim 14, wherein the buffer layer is a SiN layer with a thickness of 50-100 nm or a SiO layer with a thickness of 150-300 nm.

17. The array substrate according to claim 14, wherein the porous metal film is made of silver, gold or platinum.

18. A display device, comprising the array substrate according to claim 14.

19. The display device according to claim 18, wherein the thin film transistor further comprises a buffer layer between the base substrate and the poly-silicon layer.

20. The display device according to claim 18, wherein the buffer layer is a SiN layer with a thickness of 50-100 nm or a SiO layer with a thickness of 150-300 nm.

\* \* \* \* \*